US010826276B2

(12) United States Patent
Lauer et al.

(10) Patent No.: US 10,826,276 B2
(45) Date of Patent: Nov. 3, 2020

(54) SEMICONDUCTOR LASER

(71) Applicant: OSRAM Opto Semiconductors GmbH, Regensburg (DE)

(72) Inventors: Christian Lauer, Pettendorf (DE); Tomasz Swietlik, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/347,026

(22) PCT Filed: Nov. 15, 2017

(86) PCT No.: PCT/EP2017/079315
§ 371 (c)(1),
(2) Date: May 2, 2019

(87) PCT Pub. No.: WO2018/091527
PCT Pub. Date: May 24, 2018

(65) Prior Publication Data
US 2019/0273362 A1 Sep. 5, 2019

(30) Foreign Application Priority Data
Nov. 17, 2016 (DE) .................. 10 2016 122 147

(51) Int. Cl.
*H01S 5/32* (2006.01)
*H01S 5/10* (2006.01)
(Continued)

(52) U.S. Cl.
CPC .......... *H01S 5/3215* (2013.01); *H01S 5/1003* (2013.01); *H01S 5/221* (2013.01);
(Continued)

(58) Field of Classification Search
CPC ...... H01S 5/3215; H01S 5/1003; H01S 5/221; H01S 5/323; H01S 5/3213; H01S 5/32316
See application file for complete search history.

(56) References Cited

U.S. PATENT DOCUMENTS 5,719,894 A 2/1998 Jewell et al.
5,764,668 A 6/1998 Ishizaka
(Continued)

FOREIGN PATENT DOCUMENTS

CN 101159366 A 4/2008
CN 102570308 A 7/2012
(Continued)

OTHER PUBLICATIONS

English Translation of CN101159366A (Year: 2008).*
(Continued)

*Primary Examiner* — Yuanda Zhang
(74) *Attorney, Agent, or Firm* — DLA Piper LLP (US)

(57) ABSTRACT

A semiconductor laser including an active zone and a waveguide, wherein the active zone includes an active layer configured to generate electromagnetic radiation during operation of the semiconductor laser, the waveguide is configured to guide the electromagnetic radiation generated during operation of the semiconductor laser within the semiconductor laser, the waveguide includes a subregion formed from a compound semiconductor material, wherein a proportion of a material of the compound semiconductor material gradually increases in the entire subregion along the vertical direction toward the active zone so that a refractive index of the subregion gradually decreases toward the active zone, and the proportion is an aluminum proportion or a phosphorus proportion.

17 Claims, 11 Drawing Sheets

(51) Int. Cl.
*H01S 5/22* (2006.01)
*H01S 5/323* (2006.01)
(52) U.S. Cl.
CPC ............ *H01S 5/323* (2013.01); *H01S 5/3213* (2013.01); *H01S 5/32316* (2013.01); *H01S 2301/18* (2013.01)

(56) References Cited

U.S. PATENT DOCUMENTS

| | | |
|---|---|---|
| 6,434,178 B1 | 8/2002 | Ubukata |
| 2004/0051107 A1 | 3/2004 | Nagahama |
| 2004/0125839 A1 | 7/2004 | Lee |
| 2011/0266567 A1 | 11/2011 | Brick |
| 2012/0201262 A1* | 8/2012 | Schillgalies ............ H01S 5/22 372/44.01 |
| 2013/0039376 A1 | 2/2013 | Eichler et al. |

FOREIGN PATENT DOCUMENTS

| | | |
|---|---|---|
| CN | 104332825 A | 2/2015 |
| DE | 10 2010 009 457 A1 | 9/2011 |
| WO | 96/30945 A2 | 10/1996 |
| WO | 2006/034490 A2 | 3/2006 |
| WO | 2009-067969 A1 | 6/2009 |

OTHER PUBLICATIONS

The First Office Action dated Jun. 11, 2020, of counterpart Chinese Application No. 201780071378.2, along with an English translation.

* cited by examiner

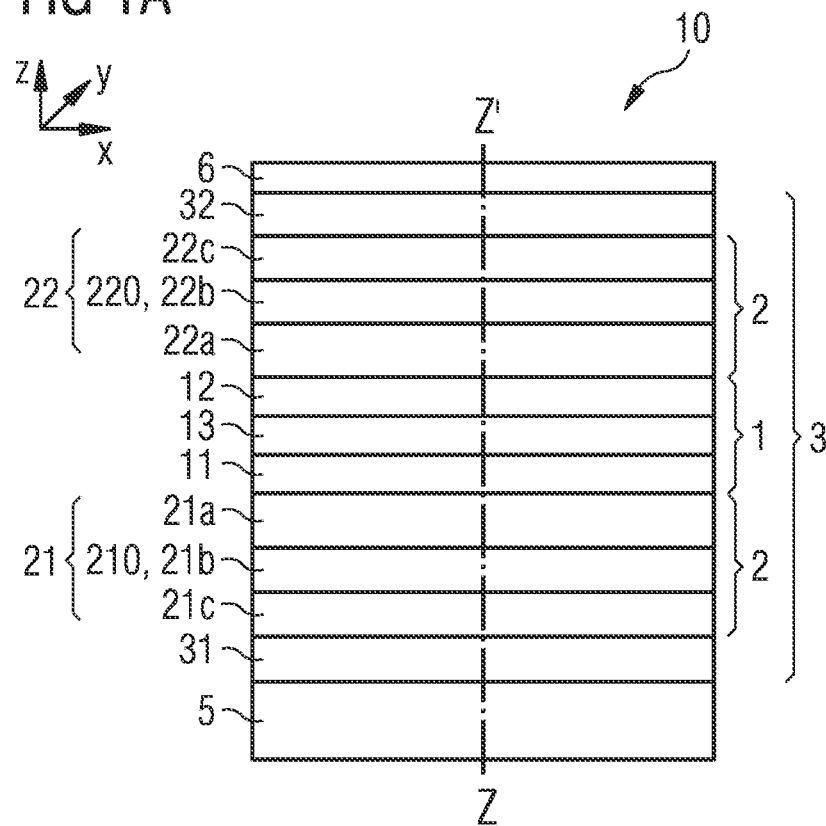
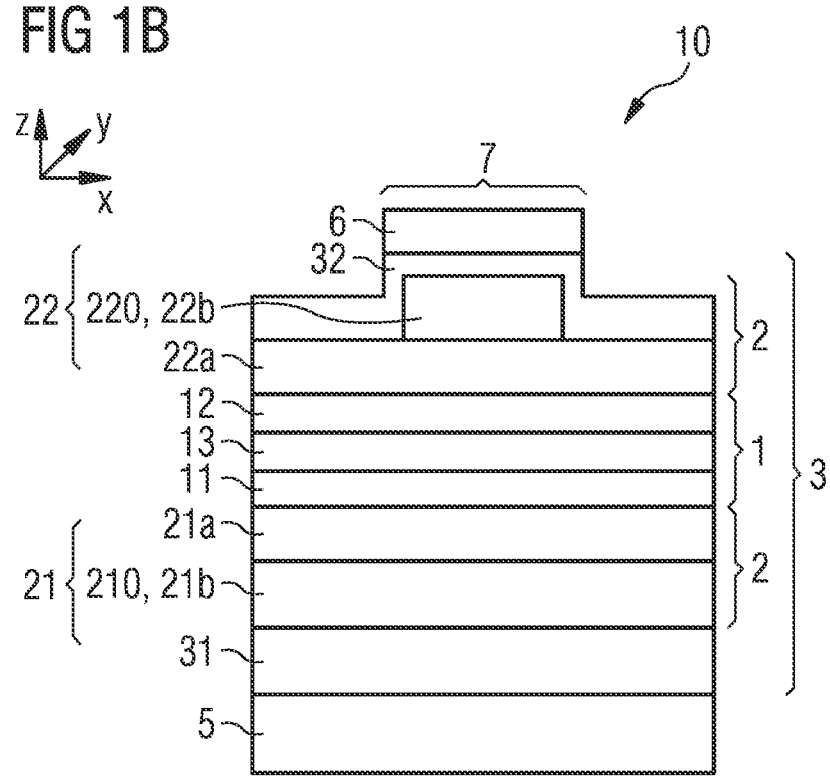

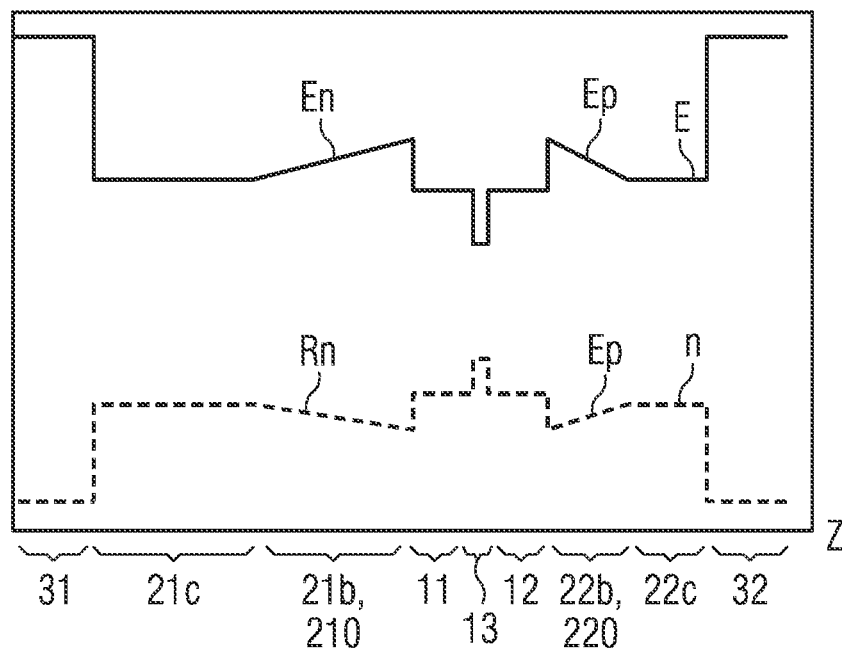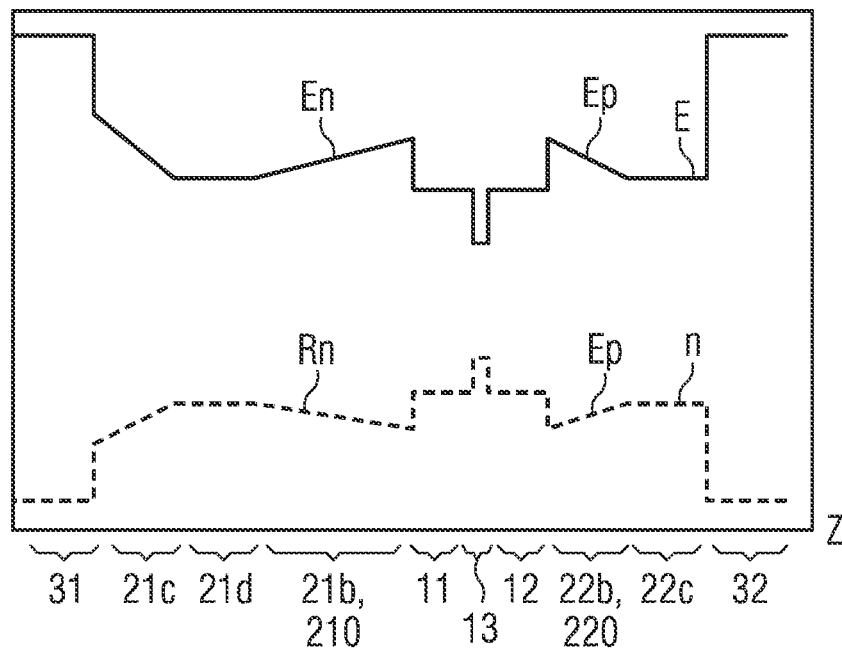

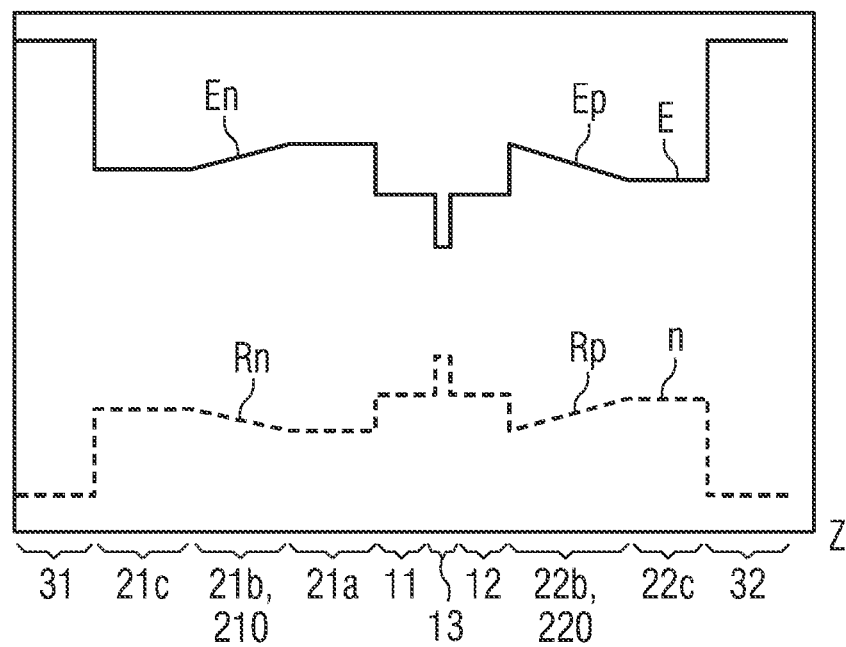
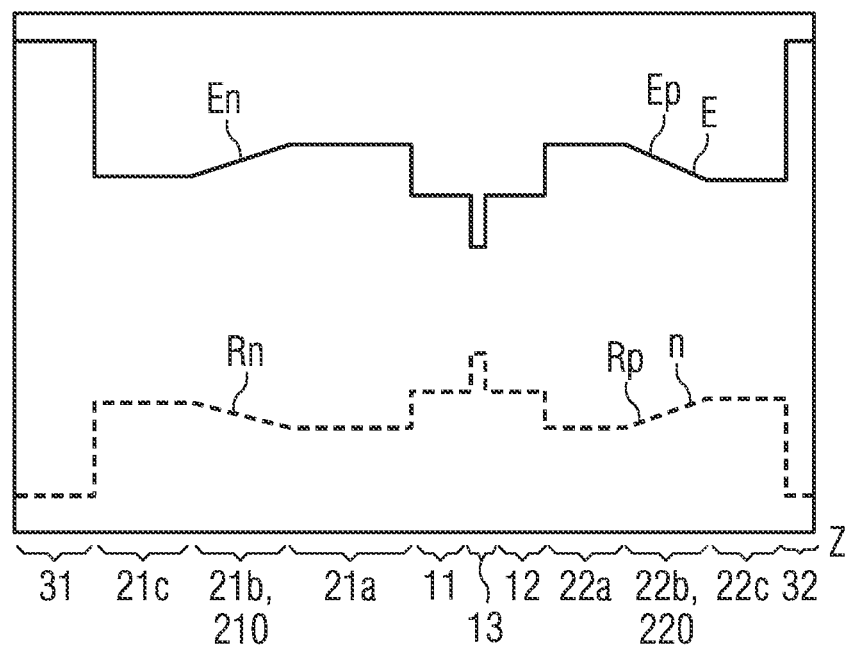

SEMICONDUCTOR LASER

TECHNICAL FIELD

This disclosure relates to a semiconductor laser.

BACKGROUND

Laser diodes require high efficiency and high beam quality. The laser diodes should have low electrical series resistances to achieve high efficiency even at high powers. Depending on the application, laser diodes should have certain radiation characteristics, e.g. predetermined aspect ratios with respect to beam divergences in vertical and lateral direction. In practice, low values of series resistance and vertical beam divergence or of beam parameter product are usually aimed at. In general, the series resistance and the vertical beam divergence are determined by the layer structure of the laser diode and cannot easily be adjusted independently from each other due to changes in the layer structure. To achieve high efficiency, leakage currents that occur increasingly in particular at high temperatures and/or high operating currents, should also be prevented as far as possible.

It could therefore be helpful to provide a semiconductor laser having improved efficiency as well as a semiconductor laser having a plurality of degrees of freedom to adjust the electrical series resistance, the vertical beam divergence and/or the lateral beam divergence.

SUMMARY

We provide a semiconductor laser including an active zone and a waveguide, wherein the active zone includes an active layer configured to generate electromagnetic radiation during operation of the semiconductor laser, the waveguide is configured to guide the electromagnetic radiation generated during operation of the semiconductor laser within the semiconductor laser, the waveguide includes a subregion formed from a compound semiconductor material, wherein a proportion of a material of the compound semiconductor material gradually increases in the entire subregion along the vertical direction toward the active zone so that a refractive index of the subregion gradually decreases toward the active zone, and the proportion is an aluminum proportion or a phosphorus proportion.

We also provide a semiconductor laser including an active zone and a waveguide, wherein the active zone includes an active layer configured to generate electromagnetic radiation during operation of the semiconductor laser, the waveguide is configured to guide the electromagnetic radiation generated during operation of the semiconductor laser within the semiconductor laser, the waveguide includes a subregion formed from a compound semiconductor material, wherein a proportion of a material of the compound semiconductor material gradually increases in the entire subregion along the vertical direction toward the active zone so that a refractive index of the subregion gradually decreases toward the active zone, the proportion is an aluminum proportion or a phosphorus proportion, the waveguide has a further subregion spatially spaced apart from the subregion, each of the subregions having an Al-proportion or phosphorus proportion gradually increasing towards the active zone, wherein among the subregions, an n-side subregion belongs to an n-side area of the waveguide and a p-side subregion belongs to a p-side area of the waveguide, a progression of the proportion of the one material of the n-side subregion and a progression of the proportion of the one material of the one material of the p-side subregion each take the form of a ramp gradually ascending toward said active zone, the p-side subregion and the n-side subregion have vertical extensions of different sizes, and the p-side subregion has a higher average proportion of the one material than the n-side subregion.

We further provide a semiconductor laser including an active zone and a waveguide, wherein the active zone includes an active layer configured to generate electromagnetic radiation during operation of the semiconductor laser, the waveguide is configured to guide the electromagnetic radiation generated during operation of the semiconductor laser within the semiconductor laser, the waveguide includes a subregion formed from a compound semiconductor material, wherein a proportion of a material of the compound semiconductor material gradually increases in the entire subregion along the vertical direction toward the active zone so that a refractive index of the subregion gradually decreases toward the active zone, and the proportion is a phosphorus proportion of the compound semiconductor material that gradually increases in the entire subregion along the vertical direction toward the active zone.

BRIEF DESCRIPTION OF THE DRAWINGS

FIG. 1A shows an example of a semiconductor laser in schematic sectional view.

FIG. 1B shows another example of a semiconductor laser in schematic sectional view.

FIGS. 3A to 3C, 4A to 4B, 5A to 5D, 6A to 6B, 7A to 7B, 8A to 8C and 9A to 9B show schematic illustrations of the band structure progression and the refractive index progression along the vertical direction of various semiconductor lasers.

LIST OF REFERENCE NUMERALS

Figure 2A:
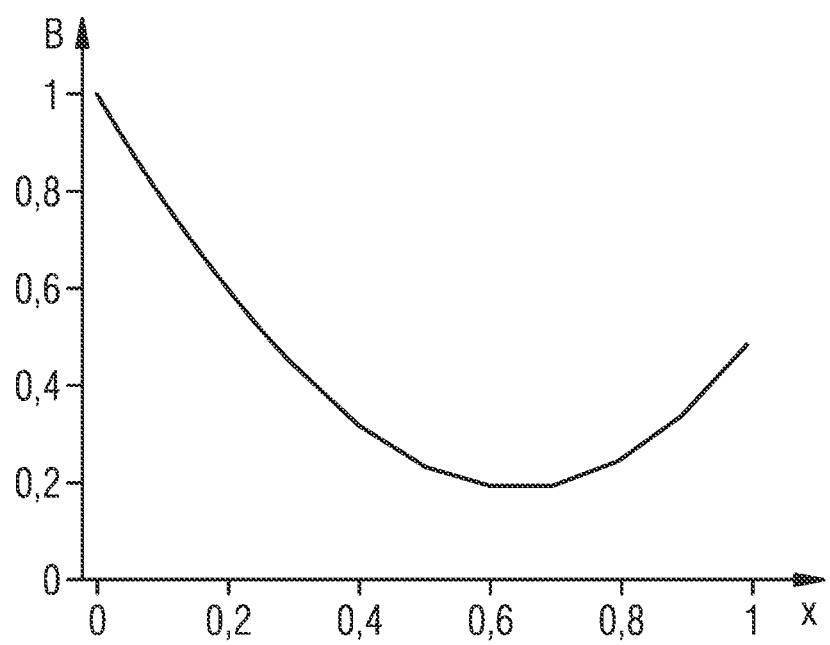
FIG. 2A shows a schematic illustration of the charge carrier mobility as a function of the Al-proportion in a layer made of a compound semiconductor material.

10 Semiconductor laser
1 active zone
11 n-side layer of the active zone
12 p-side layer of the active zone
13 active layer of the active zone
2 waveguide
21 n-side area of the waveguide
21a-d subareas of the n-side area
210 n-side subregion of the waveguide
22 p-side area of the waveguide
22a-c subareas of the p-side area
220 p-side subregion of the waveguide
3 semiconductor body
31 n-side cladding layer
32 p-side cladding layer
41 hole barrier
42 electron barrier
5 substrate
6 contact layer
7 ridge Rn, En n-side ramp
Rp, Ep p-side ramp

DETAILED DESCRIPTION

The semiconductor laser has an active zone and a waveguide. The active zone has an active layer configured to generate electromagnetic radiation during operation of the semiconductor laser. The waveguide is configured to guide the electromagnetic radiation generated during operation of the semiconductor laser within the semiconductor laser. The waveguide comprises at least one subregion formed from a compound semiconductor material, wherein a proportion of the one material of the compound semiconductor material gradually increases in the entire subregion along the vertical direction toward the active zone, as a result of which a refractive index of the subregion gradually decreases toward the active zone. Gradually means for instance monotonously in small steps.

The active region may comprise an n-side layer and a p-side layer, wherein the active zone is disposed between the n-side layer and the p-side layer. For example, the semiconductor laser is a laser diode, especially an edge-side-emitting laser diode. The n-side layer of the active zone is arranged vertically between the active layer and an n-side area of the waveguide. The n-side and p-side layers can form secondary wells of the active zone of the semiconductor laser. Alternatively, it is possible that the active layer is embedded directly in the waveguide so that the semiconductor laser can be free of secondary wells.

The subregion of the waveguide is preferably formed from an aluminum-containing and/or phosphorus-containing compound semiconductor material, wherein an aluminum proportion (Al-proportion) and/or a phosphorus proportion (P-proportion) gradually increase/increases in the entire subregion along the vertical direction towards the active zone. Within the subregion, the Al-proportion or P-proportion decreases gradually with increasing vertical distance from the active zone, i.e. for instance monotonously in small steps.

Such a design, preferably with a gradual change of the Al-proportion in the waveguide, allows the quality with respect to wave guidance to be maintained while the overall series resistance of the semiconductor laser is reduced. This is due to the fact that the charge carrier mobility increases overproportionately with the reduction of the Al-proportion, while the refractive index increases only approximately proportionally. Due to the subregion having gradually decreasing Al-proportion away from the active zone, the charge carrier mobility increases overproportionately with increasing distance from the active zone, as a result of which the series resistance undergoes a significant change. At the same time, the properties of the waveguide with respect to wave-guiding are only slightly affected due to the comparatively smaller change in the refractive index. The Al-proportion is therefore preferably reduced in the subregion of the waveguide, where the influence on the resistance is greater than on the wave guidance and thus on the near and far-field divergence.

In this respect, the key characteristics of the semiconductor laser such as series resistance and beam divergence can be set somewhat more independently from each other than, for example, in a standard semiconductor laser, in which only a constantly high proportion of the one material is used for the entire n-side or p-side waveguide area, or in which even a proportion increasing away from the active zone is used. Starting from a reference semiconductor laser, without changing the total thickness, the vertical position or other properties of the active zone of the reference semiconductor laser, by varying the proportion of the one material in the subregion of the waveguide, the vertical near-field width and far-field width of a laser that are directly related to the vertical beam divergence, can be changed within certain limits in a targeted manner. This is particularly advantageous in the further development or in the adjustment of series resistance and/or beam divergence in existing products requiring established high-precision manufacturing processes or assembly processes, where very high accuracies are required for the vertical position of the light emission of the semiconductor laser.

A vertical direction is understood to mean a direction directed transversely, in particular perpendicularly, to a main extension surface of the active zone. For example, the vertical direction is parallel to a growth direction of the active zone. A lateral direction is generally understood to mean a direction running along, in particular parallel to the main extension surface of the active zone. In particular, the lateral direction is perpendicular to a longitudinal direction indicating the resonator direction of the semiconductor laser. In an edge-side-emitting semiconductor laser, the radiation generated during operation of the semiconductor laser is radiated in particular in a longitudinal direction, i.e. in a direction transverse or essentially perpendicular to the vertical and lateral directions.

The semiconductor laser may be based on a III-V or II-VI compound semiconductor material. The semiconductor laser can have a semiconductor body that, for example, is epitaxially applied to or arranged on a substrate of the semiconductor laser. The semiconductor body can only have semiconductor layers. In particular, the semiconductor body comprises the active zone, the waveguide and possible cladding layers of the semiconductor laser. The compound semiconductor material may contain aluminum or phosphorus. In particular, the waveguide is based on a compound semiconductor material containing aluminum and/or phosphorus.

A change, in particular an absolute change in the proportion of the one material within the subregion, may be at least 0.5%, preferably 0.5% to 20%, for example, 1% to 10%, or 1% to 5%, for instance 1% to 3%. For example, this may be a change in the Al-proportion and/or P-proportion of the compound semiconductor material.

A proportion and/or a change in the proportion of the one material in a semiconductor layer or in a compound semiconductor material may be expressed by the proportion x or y in a ratio formula such as $Al_xGa_{1-x-y}In_y$ with $0 \le x \le 1$, $0 \le y \le 1$ and $x+y \le 1$ or in a ratio formula such as $Al_xGa_{1-x-y}In_y$ with $0 \le x \le 1$, $0 \le y \le 1$. For example, if the Al-proportion x increases from 0.1 to 0.2 in the entire subregion along the vertical direction to the active zone, the change is 10%. The semiconductor laser may be based on AlGaAs, AlGaAsP, InGaAlP, AlGaN, AlGaInN, GaN and other III-V or II-VI compound semiconductor materials depending on the desired emission wavelength.

The waveguide may have a p-side area. The active zone may be arranged vertically between the n-side area and the p-side area. The subregion having the gradually increasing proportion of the one material towards the active zone can be assigned to the n-side area or to the p-side area of the waveguide. In particular, the p-side area and the n-side area of the waveguide may each have a subregion whose Al-proportion or P-proportion gradually increases in the entire respective subregion along the vertical direction towards the active zone. In other words, the waveguide may have an n-side subregion and a p-side subregion whose Al-proportion or P-proportion is reduced as the distance from the active zone increases. The subregions can be asymmetrical with regard to their layer thickness, material composition, proportion of the one material and/or distance to the active zone. This additional degree of freedom allows a precise adjustment of a desired vertical beam divergence or of a desired vertical far-field width without significantly affecting other key characteristics of the semiconductor laser.

The waveguide may have two spatially spaced subregions, each having a gradually increasing proportion of the one material such as the Al-proportion or the P-proportion, towards the active zone. For example, the waveguide contains an n-side subregion associated with the n-side area and a p-side subregion associated with the p-side area. One subregion may have a vertical layer thickness of at most 100%, for instance 5% to 95%, 5% to 75%, or 10% to 50%, or 25% to 50% of a vertical layer thickness of the other subregion. One subregion may be the p-side subregion and the other subregion may be the n-side subregion, or vice versa.

The waveguide may be formed such that a progression of the proportion of the one material such as the Al-proportion of the n-side subregion and a progression of the proportion of the one material such as the Al-proportion of the p-side subregion each take the form of a ramp gradually increasing toward the active zone. Preferably, the p-side subregion has a smaller vertical extent and a smaller vertical distance to the active zone than the n-side subregion. The p-side region may have a higher average Al-proportion than the n-side subregion. This can form an energy barrier in the conduction band, in particular an electron barrier that hinders or prevents the electrons from leaving the active zone and thus suppresses leakage currents. Alternatively, it is also possible for the p-side subregion to have a lower average Al-proportion than the n-side subregion so that it is also possible that a hole barrier is formed in the waveguide to suppress leakage currents. Preferably, the electron and/or hole barrier/s are/is formed mainly or exclusively by different Al-proportions in the subareas of the waveguide adjacent to the active zone.

The subregion of the waveguide may directly adjoin the active zone. It is possible that the subregion of the waveguide is formed by the entire n-side area or the entire p-side area of the waveguide. Alternatively, it is also possible that the subregion having the gradually increasing proportion of the one material towards the active zone such the Al-proportion is formed exclusively by a subarea of the n-side or p-side area of the waveguide.

The waveguide may have an inner edge-side subarea arranged in the vertical direction between the subregion and the active zone. In this example, the subregion is spaced apart from the active zone at least by the inner edge-side subarea. The subregion and the edge-side subarea of the waveguide can be on the n-side or p-side. In particular, the edge-side subarea adjoins both the subregion and the active zone. Preferably, the subregion has a lower average proportion of the one material such as a lower average proportion of Al, than the inner edge-side subarea. Due to the different Al-proportions, the subregion may have a higher refractive index than the inner edge-side subarea as a result of which a desired wave guidance in the waveguide can be achieved.

The inner edge-side subarea of the waveguide is preferably formed such that its proportion of the one material, preferably its Al-proportion, is substantially constant or remains constant or even decreases along the vertical direction towards the active zone. In particular, an average Al-proportion of the inner edge-side subarea is higher than an average Al-proportion of the subregion. As the distance from the active zone increases, beginning at a certain distance from the active zone for instance given by the vertical layer thickness of the inner edge-side subarea, the Al-proportion is reduced. The active zone and its properties can remain virtually unaffected compared to an active zone of a reference structure, for example, in existing products requiring established high-precise manufacturing processes, while the series resistance is reduced overall. Essentially, the beam quality or the beam divergence can also be maintained. This is due to the fact that the gradual change in the proportion of the one material such as the Al-proportion takes place in a subregion or in subregions of the waveguide vertically spaced from the active zone. In these subregions, the variation of the proportion of the one material, preferably of Al, has a greater positive influence on the series resistance than on the wave guidance and thus on the beam divergence. The variation of the Al-proportion in the subregions of the waveguide thus contributes to increasing the efficiency of the semiconductor laser without significantly changing other key characteristics of the semiconductor laser.

The waveguide may have a further, in particular an outer edge-side subarea, wherein the subregion is arranged between the further edge-side subarea and the active zone. A proportion of the one material such as an Al-proportion or P-proportion, of the outer edge-side subarea may remain constant or in particular gradually decrease along the vertical direction toward the active zone. The outer edge-side subarea may have a higher refractive index than the subregion due to its material composition or Al or P-proportions. In particular, the semiconductor laser has a cladding layer adjacent to the outer edge-side subarea. To achieve a desired wave guidance within the waveguide, the outer edge-side subarea of the waveguide preferably has a higher refractive index than the cladding layer. The waveguide can have both an n-side and a p-side outer edge-side subarea.

The subregion having the gradually increasing proportion of the one material such as Al or P-proportion towards the active zone may be formed by an n-side subarea, i.e. by a subarea of the n-side area of the waveguide. The n-side subarea has a vertical layer thickness of at least 0.1 µm, 0.25 µm, 0.5 µm, for instance 0.8 µm or 1 µm or at least 1.5 µm. For example, the n-side subregion has a vertical layer thickness of 0.1 µm to 4 µm, for instance 0.1 µm to 3 µm, or 0.1 µm to 2 µm inclusive, or 0.1 µm to 1 µm.

The subregion having the gradually increasing proportion of the one material, for instance Al or P-proportion, towards the active zone may be formed by a p-side subarea, i.e. by a subarea of a p-side area of the waveguide. The p-side subregion may have a vertical layer thickness of at least 0.1 µm or at least 0.25 µm or at least 0.5 µm. The p-side subarea of the waveguide forming the subregion may have a vertical layer thickness of 0.1 µm to 4 µm, for instance 0.1 µm to 2 µm, or 0.1 µm to 1 µm.

The semiconductor laser may have an electron barrier and/or a hole barrier formed in an edge-side area of the waveguide, a border area or border areas between the waveguide and the active zone. The electron barrier or the hole barrier can be formed within the waveguide, e.g. in an edge-side area of the waveguide direct to the active zone.

To minimize leakage currents, a sufficiently high energy barrier can usually be formed by a strong contrast with respect to the material composition and/or in an area of increased doping at or near the border area between the waveguide and the active zone. However, an abrupt modification of the material composition and/or the doping in the vicinity of the active zone leads to undesirable disadvantages such as reduced mode stability, modified near-field and far-field and/or increased losses for the light circulating around the active zone. Preferably, the electron barrier or the hole barrier is formed, inter alia, when the waveguide has a first Al-proportion at its n-side border area to the active zone and a second Al-proportion different from the first Al-proportion at a p-side border area to the active zone. For example, exclusively by setting different Al-proportions on the n-side and on the p-side of the waveguide or of the active zone and/or by appropriate doping of the layers of the waveguide, energy barriers can be generated in the conduction band or in the valence band. The electron barrier and hole barrier formed exclusively by setting different Al-proportions can reduce the leakage current without causing the undesirable disadvantages mentioned above and thus increase the efficiency of the semiconductor laser. The energy barrier can be formed on the n-side to reduce hole leakage currents or on the p-side to reduce electron leakage currents or on both sides.

The semiconductor laser may have a p-side cladding layer. The subregion having the gradually increasing proportion of the one material towards the active zone, for instance the Al or P-proportion, can be formed by a subarea of the n-side area of the waveguide. In particular, the active zone, for instance the p-side layer of the active zone directly adjoins the p-side cladding layer. Alternatively, it is also possible that the active zone or the p-side layer of the active zone is spaced from the p-side cladding layer exclusively by a p-side area of the waveguide, wherein the p-side area can have a maximum layer thickness of 0.01 μm, 0.1 μm or 0.5 μm or of 2 μm.

In such a design of the semiconductor laser, it is free or essentially free of a p-side area of the waveguide. In other words, the semiconductor laser only has a very thin p-side waveguide or no real p-side waveguide. Such semiconductor lasers often greatly suffer from efficiency losses due to coupling to higher vertical modes. Due to the subregion of the waveguide comprising the proportion of the one material which decreases with increasing distance from the active zone, the coupling to higher vertical modes can be suppressed since the refractive index of the subregion increases with increasing distance from the active zone and thus promotes the wave guidance.

The semiconductor laser may be formed as a ridge laser. In this example, the semiconductor laser has a vertically protruding ridge formed as a p-side waveguide in the lateral direction. In a plan view, the ridge has in particular a smaller lateral width and/or length than the active zone. The ridge can have a contact layer, a p-side cladding layer and at least a subarea of the p-side waveguide. In particular, the p-side subregion is partially or completely included within the area of the ridge. The p-side waveguide may exhibit a local variation in the proportion of the one material, preferably in the Al- or P-proportion, and thus a related local modification of the refractive index formed preferably to adjust the lateral wave guidance within and below the ridge. Depending on the application, the near and far-field of the semiconductor laser can be adjusted by the design of the ridge accordingly. Alternatively, the p-side subregion may also be located outside the ridge.

In general, the series resistance is determined in particular by the Al-proportion in the entire waveguide. The vertical beam divergence and the vertical far-field width, on the other hand, are predominantly determined by the Al-proportions of the subareas and inner edge regions of the waveguide facing the active zone. In addition, leakage currents can be suppressed by local energy barriers. The energy barrier is formed in particular by different proportions of Al only in the inner edge regions of the waveguide. Other parameters of the semiconductor laser such as the near and far-field are determined, inter alia, by extension of the waveguide mode and thus by the waveguide properties of a larger area of the waveguide. Thus, different characteristics or parameters of the semiconductor laser can be adjusted at least partially independently by a gradual variation of the Al-proportion in one or more subregions of the waveguide. Such parameters are, for example, series resistance, near-field width, far-field width or mode stability of the semiconductor laser.

Further advantages, preferred configurations and further developments of the semiconductor layer will become apparent from the examples explained below in conjunction with FIGS. 1 to 10.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

An example of a semiconductor laser is shown schematically in sectional view in the xz plane in FIG. 1A, where x denotes a lateral direction and z a vertical direction. Another lateral direction y such as the longitudinal direction, which for instance indicates the resonator direction, is perpendicular to the x-direction. Along the dotted ZZ' line, further parameters of the semiconductor laser, e.g. in connection with the band structure progression or with the refractive index progression, are schematically shown in following FIGS. 3A to 9B.

The semiconductor laser 10 has a semiconductor body 3 arranged in the vertical direction between a substrate 5 and a contact layer 6. In particular, substrate 5 is a growth substrate on which the semiconductor body 3 is epitaxially deposited, for example. The semiconductor body 3 has an active zone 1 and a waveguide 2. The active zone 1 has an n-side layer 11, a p-side layer 12 and an active layer 13 arranged between the n-side layer 11 and the p-side layer 12. When the semiconductor laser 10 is in operation, the active layer 13 is configured to generate electromagnetic radiation. In particular, the semiconductor laser 10 is an edge-side-emitting semiconductor laser, wherein the radiation emitted during operation of the semiconductor laser is coupled out at a vertical side surface of the semiconductor laser in a direction transverse, for instance perpendicular, to this surface.

The waveguide 2 is configured to guide the electromagnetic radiation generated during operation of the semiconductor laser within the semiconductor laser 10. Preferably, the waveguide 2 is formed with respect to its material composition and layer thicknesses such that at least 50%, preferably at least 70%, 80% or at least 90% of the total intensity of the basic mode of the laser is concentrated within the waveguide 2. The waveguide 2 has an n-side area 21 and a p-side area 22. The n-side area 21 may have one subarea or a plurality of subareas 21a, 21b or 21c. Analogously, the p-side area 22 may have a subarea or a plurality of subareas 22a, 22b or 22c.

It is possible that the n-side layer 11 and the p-side layer 12 partly contribute to guiding the basic mode. In this sense, the n-side layer 11 and the p-side layer 12 of the active zone 1 can form a so-called secondary well of the waveguide 2. Preferably, the n-side layer 11 and the p-side layer 12 each have a higher refractive index than a subarea 21a or 22a adjacent to the n-side layer 11 or to the p-side layer 12.

These subareas 21a and 22a are referred to as inner edge-side subareas of the waveguide 2.

The semiconductor laser 10 has an n-side cladding layer 31 and a p-side cladding layer 32, wherein the waveguide 2 is arranged in the vertical direction between the n-side cladding layer 31 and the p-side cladding layer 32. The cladding layers 31 and 32 generally have a lower refractive index than a subarea 21c or 22c of the waveguide 2 to achieve a desired wave guidance. The subareas 21c and 22c that each adjoin a cladding layer 31 or 32 are referred to as outer edge-side subareas of the waveguide 2. The inner and outer edge-side subareas of the n-side area 21 or of the p-side area 22 of the waveguide 2 may differ in their material composition, doping and/or layer thicknesses.

The semiconductor body 3 is based in particular on a III-V or II-VI compound semiconductor material. In particular, waveguide 2 is based on an aluminum-containing compound semiconductor material. The waveguide 2 preferably has a subregion 210 or 220 formed from an aluminum-containing and/or phosphorus-containing compound semiconductor material.

A modification in the Al- and/or P-proportion has direct consequences for the band structure profile and for the refractive index profile of the corresponding subregions. For example, while the band gap increases with increasing Al-proportion, the refractive index decreases with increasing Al-proportion. Also the charge carrier mobility, especially the hole mobility, directly depends on the Al-proportion in the corresponding aluminum-containing layer. We found that the charge carrier mobility increases overproportionately with the reduction of the Al-proportion, while the refractive index increases for instance only proportionally. On the basis of this knowledge, the Al-proportion in the subregion 210 and/or 220 can be varied such that the series resistance is kept low at least within these subregions, while the waveguide characteristic of the waveguide 2 remains essentially unchanged. Thus, the series resistance and the beam divergence or the far-field width of the semiconductor laser 10 can be adjusted somewhat more independently of each other.

This can be achieved by gradually increasing an Al-proportion in the entire subregion 210 or 220 along the vertical direction towards the active zone 1. In other words, the Al-proportion of the waveguide 2 in the subregion 210 or 220 is gradually reduced as the distance from the active zone 1 increases. The subregion 210 or 220 may be formed by a subarea of the waveguide 2, for instance by the subarea 21b or 22b as shown in FIG. 1A. Deviating from FIG. 1A, it is also possible that the subregion 210 or 220 is formed by a subarea other than 21b or 22b of the waveguide 2. In FIG. 1A, the waveguide 2 has two spatially spaced subregions 210 and 220, each comprising an Al-proportion which preferably increases, especially gradually increases along the vertical direction towards the active zone 1. The n-side subregion 210 is assigned to the n-side area 21 of the waveguide 2 and the p-side subregion 220 is assigned to the p-side area 22 of the waveguide 2.

With respect to the active zone 1, the areas 21 and 22 shown in FIG. 1A having the associated subareas or subregions may be formed to be asymmetrical regarding their material composition, layer thicknesses, Al proportions and/or dopants. Deviating from FIG. 1A, it is also possible that the semiconductor 10 is free from at least one or more edge-side subareas 21a, 21c, 22a and/or 22c. It is also possible that the semiconductor laser 10 is free or substantially free from the p-side area 22. In this example, the semiconductor laser 10 has no real p-side waveguide layers or only a very thin p-side area 22.

The semiconductor laser 10 according to FIG. 1A can be formed as a wide-strip laser. In a wide-strip laser, generated radiation is decoupled especially over the entire lateral width of the active layer 13. The radius of the beam waist is thus comparable to the lateral width of the semiconductor laser 10. According to FIG. 1B, the semiconductor laser 10 is formed as a ridge laser which, in contrast to the example shown in FIG. 1A, has a ridge 7. In a plan view of the semiconductor laser 10, the ridge 7 has smaller lateral expansions than the active zone 1, the active layer 13 and the substrate 5. In a ridge laser, charge carriers are preferably impressed into the active zone 1 in the region of the ridge 7 so that electromagnetic radiation is generated more frequently in regions of the active layer 13 which, in a top view, are covered by the ridge 7. Due to its geometry, the contact layer 6 is formed such that it electrically contacts the active zone 1 only in the region of the ridge 7. By designing the ridge 7, the radius of the beam waist of the semiconductor laser 10 can be adjusted according to the intended application.

The ridge 7 comprises in particular the p-side cladding layer 32 and at least a subarea 22b of the n-side area 22 of the waveguide 2. The ridge 7 projects vertically from its surrounding surfaces of the semiconductor laser 10. To form the ridge 7, the semiconductor laser 10 can be etched in places along the vertical direction. The ridge 7 can be configured as the p-side waveguide to laterally guide the wave, wherein the p-side waveguide has a local variation of the Al-proportion and a related local modification of the refractive index configured to adapt the lateral wave guidance within and below the ridge 7. In particular, the ridge 7 comprises the p-side subregion 220. Deviating from FIG. 1B, it is possible that subarea 22b, which in particular forms subregion 220, is at least partially or completely outside the ridge 7.

Figure 2B:
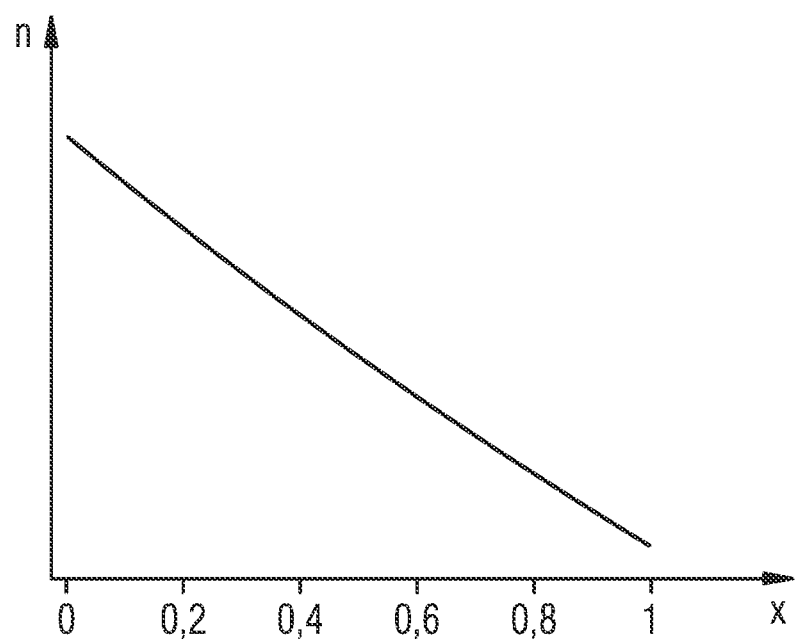
FIG. 2B shows a schematic illustration of the refractive index as a function of the Al-proportion in a layer made of a compound semiconductor material.

FIG. 2A shows a normalized charge carrier mobility B, in particular the hole mobility, as a function of the Al-proportion x in $Al_xGa_{1-x}As$ with $0 \leq x \leq 1$. The charge carrier mobility, in this case the hole mobility B, decreases with increasing Al-proportion x to approximately 0.6 and increases again from approximately 0.6 to 1. FIG. 2B shows the refractive index of $Al_xGa_{1-x}As$ with $0 \leq x \leq 1$ as a function of the Al-proportion x. The refractive index n decreases monotonously with increasing Al-proportion x. The refractive index n is determined at a wavelength of about 970 nm. For the sake of simplicity, the examples described here and below can refer to the AlGaAs-based layer structure of a semiconductor laser. However, the main statements can be transferred to other material systems such as to other III-V and II-VI material systems, in particular also to phosphorus-containing material systems and variation of the phosphorus proportion.

Figure 3A:
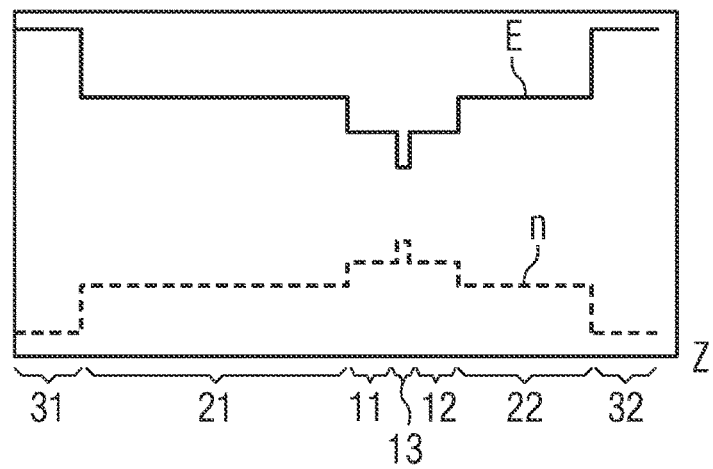

FIG. 3A schematically shows the profile of the band gap E and the refractive index n of a conventional epitaxial structure for a semiconductor laser along a vertical direction. The n-side area 21 and the p-side area 22 of the waveguide 2 each have a constant Al-proportion along the vertical direction. Accordingly, the band gap and the refractive index n of the waveguide 2 remain substantially constant along the vertical direction.

Conventional methods used to reduce the series resistance of such a structure include reducing the layer thicknesses of the waveguide 2, increasing the dopant concentration introduced into the waveguide 2 or keeping the Al-proportion low. However, all these methods have unwanted side effects.

For example, due to the physical relationship between near-field and far-field, a reduced near-field normally results in an undesired increased vertical beam divergence due to reduced layer thicknesses. An aspect ratio of the vertical to the lateral far-field width is thus inevitably changed. Among other things, higher doping leads to higher optical losses and thus to reduced efficiency of the semiconductor laser. A low Al-proportion in the entire waveguide 2 usually leads to a reduced suppression of higher vertical modes so that the behavior of the laser can become unstable during operation. Such instabilities are expressed in abrupt jumps in output power, so-called kinks, in abrupt jumps in efficiency, in higher or multimode vertical near-fields and in widened and/or squinting far-fields, where outside the laser, the main direction of propagation differs from the resonator direction.

Figure 3B:
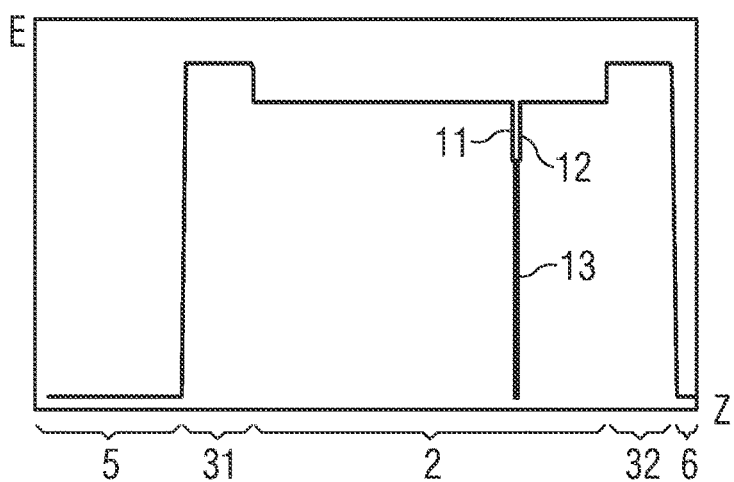
Figure 3C:
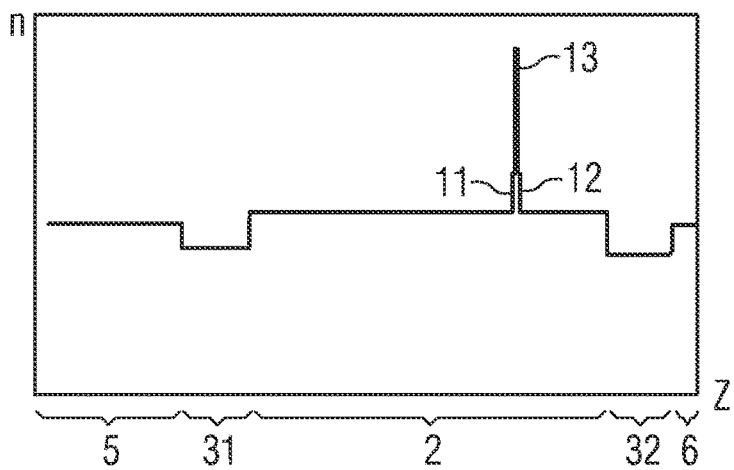

FIG. 3B shows the band gap profile of a comparison example for a semiconductor laser. Corresponding to FIG. 3B, FIG. 3C shows a refractive index profile of a comparison example for a semiconductor laser. Structurally, the layer structure shown in FIGS. 3B and 3C corresponds to the layer structure of a semiconductor laser shown in FIG. 3A.

In contrast to FIG. 3A, FIGS. 3B and 3C schematically show the substrate 5 and the contact layer 6. The layer structure shown in FIGS. 3B and 3C serves in the following as a reference structure to explain further layer structures of different semiconductor lasers with varying Al-proportion in the waveguide 2 and the associated technical effects.

Figure 4A:
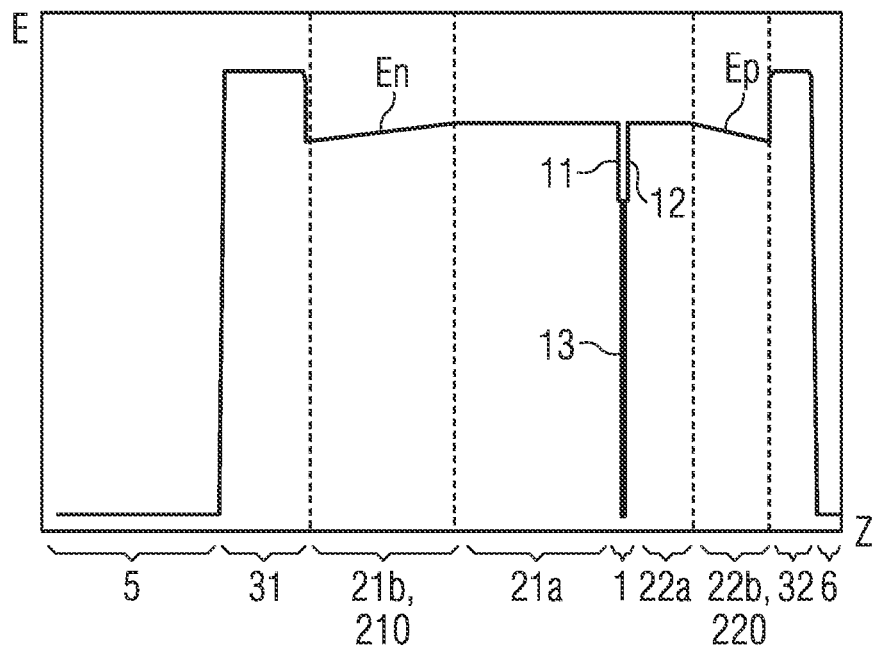

The layer structure for a semiconductor laser 10 shown in FIG. 4A essentially corresponds to the reference structure shown in FIG. 3B. In contrast, the waveguide 2 has an n-side subregion 210 and a p-side subregion 220, wherein an Al-proportion and thus the band gap E gradually increases in the entire n-side subregion 210 or in the entire p-side subregion 220 along a vertical direction towards the active zone 1. In other words, the Al-proportion in the respective subregion 210 or 220 gradually decreases with increasing vertical distance from the active zone 1. This is expressed by the corresponding band gap progression in FIG. 4A or by the refractive index progression in FIG. 4B.

The n-side subregion 210 is formed by a subarea 21b of the n-side area 21 of the waveguide 2. The n-side subregion 210 can have a vertical layer thickness of 0.1 μm to 4 μm. The n-side area 21 has a further subarea 21a adjacent to both the subregion 210 and the active zone 1. In the vertical direction, the n-side subregion 210 is spaced apart from the active zone 1 by this inner edge-side subarea 21a. The subarea 21a can have a vertical layer thickness of 0.1 μm to 4 μm. In particular, the further subarea 21a shows a constant Al-proportion is in particular higher than an average Al-proportion of the n-side subregion 210.

Analogous to the n-side area 21, the p-side area 22 of the waveguide 2 has a p-side subregion 220 which is formed by a subarea 22b of the p-side area 22. The p-side subregion 220 can have a vertical layer thickness of 0.1 μm to 4 μm. Throughout the entire p-side 220 subregion, an Al-proportion gradually increases along the vertical direction towards the active zone. In other words, the Al-proportion gradually decreases with increasing distance from the active zone 1. Compared to the reference structure shown in FIG. 3B or 3C, this leads to a reduction of the aluminum content in the respective subregions 210 and 220. This results in particular in an increased refractive index in the subregions 210 and 220 so that the basic mode is partly enhanced to be guided outside the usually highly doped and inefficient edge-side subareas 21a and 22a.

Figure 4B:
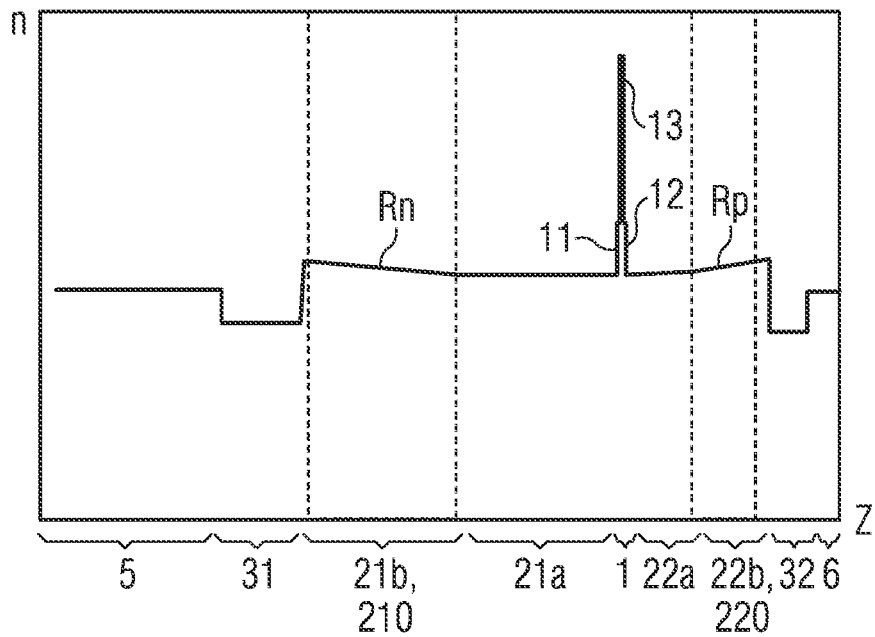

In FIG. 4A, the p-side area 22 has a further subarea 22a arranged in the vertical direction between the p-side subregion 220 and the active zone 1. In FIGS. 4A and 4B, the subarea 22a may have a vertical layer thickness of 0.1 μm to 4 μm. The further subarea 22a in particular adjoins the active zone 1 and is thus an inner edge-side subarea of the p-side area 22. The further subarea 22a in particular has a constant Al-proportion which is in particular higher than an average Al-proportion of the p-side subregion 220. In FIGS. 4A and 4B, the n-side subregion 210 and the p-side subregion 220 each adjoin a cladding layer 31 and 32, respectively.

Due to the gradual change, a profile of the Al-proportion in the n-side subregion 210 or in the p-side subregion 220 can take the form of a gradually ascending ramp towards the active zone 1. Such ramps are indicated schematically in FIGS. 4A and 4B by En and Ep in the band gap profile or by Rn and Rp in the refractive index profile. In particular, the band gap E has a ramp En or Ep in the respective subregions 210 and 220 which is analogous to the ramp with respect to the modification of the Al-proportion. The refractive index profile n has a ramp Rn or Rp in the respective subregions 210 and 220 which runs in the opposite direction to the ramp with respect to the modification of the Al-proportion.

In general, the vertical optical near-field and thus the vertical optical far-field are mainly determined by the vertical guidance in the areas 21 and 22 of the waveguide 2, including layers 11 and 12 of active zone 1 if necessary. Along the vertical direction, the optical intensity is concentrated in the area of the active zone 1 and decreases towards the outer edge-side subareas of the waveguide 2. Hence, the shape of the near-field and far-field is mainly determined by the surroundings of the active zone 1 and to a lesser extent by the edge-side subareas of the waveguide 2. In contrast, in a first approximation, the series resistance of the semiconductor laser 10 depends on all vertical layers in equal parts.

The vertical far-field width is thus mainly determined by the Al-proportions of the edge-side areas of the waveguide 2 facing the active zone 1. Compared to the reference structure shown in FIGS. 3B and 3C, the Al-proportion remains unchanged in the inner edge-side subareas 21a and 22a (see FIGS. 4A and 4B) so that the vertical far-field width is only slightly or hardly influenced by the variation of the Al-proportions in subregions 210 and 220. However, by reducing the Al-proportion in the subregions 210 and 220, a lower series resistance of the semiconductor laser 10 can be achieved. The reduction of the series resistance is therefore mainly achieved by the variation of the Al-proportions in the subareas 21b and 22b of the waveguide 2 remote from the active zone 1 and form the subregions 210 and 220 in FIGS. 4A and 4B, respectively.

The layer structure of a semiconductor laser 10 shown in FIGS. 3B to 4B has the same overall vertical height. By varying the Al-proportions in the subregions 210 and 220 each vertically spaced apart from the active zone 1 by a further subarea 21a or 22a, a reduction of the series resistance can be achieved while maintaining the overall height and an essentially unchanged far-field width of the semiconductor laser 10.

The example of a layer structure of the semiconductor laser 10 shown in FIG. 5A essentially corresponds to the examples of a layer structure shown in FIGS. 4A and 4B. In contrast, the subregions 210 and 220 directly adjoin the active zone 1. The subregions 210 and 220 thus comprise the inner edge-side subareas 21a and 22a, respectively. As a further difference, the waveguide 2 has further outer edge-side subareas 21c and 22c, wherein the n-side subregion 210 is arranged between the n-side outer edge-side subarea 21c and the active zone 1, and the p-side subregion 220 is arranged between the p-side outer edge-side subarea 22c and the active zone 1. The further subareas 21c and 22c may each have an Al-proportion that remains constant along the vertical direction to the active zone 1.

The example of a layer structure shown in FIG. 5B essentially corresponds to the example of a layer structure for a semiconductor laser shown in FIG. 5A. In contrast, the outer edge-side subarea 21c of the waveguide 2 has an Al-proportion that decreases along the vertical direction towards the active zone 1. This is expressed in the decreasing band gap E and in the increasing refractive index n in the direction of the active zone 1. In addition, the waveguide 2 has a further subarea 21d for instance having a constant Al-proportion, wherein the further subarea 21d is arranged in the vertical direction between the outer edge-side subarea 21c and the n-side subregion 210.

The example of a layer structure shown in FIG. 5C essentially corresponds to the example of a layer structure shown in FIG. 5A. In contrast to this, the n-side area 21 of the waveguide 2 has an inner edge-side subarea 21a which is arranged in the vertical direction between the n-side subregion 210 and the active zone 1.

The example of a layer structure shown in FIG. 5D essentially corresponds to the layer structure shown in FIG. 5C. In contrast, the p-side area 22 of the waveguide 2 has an inner edge-side subarea 22a, wherein the p-side subregion 220 is spaced apart from the active zone 1 by the subarea 22a.

Figure 6A:
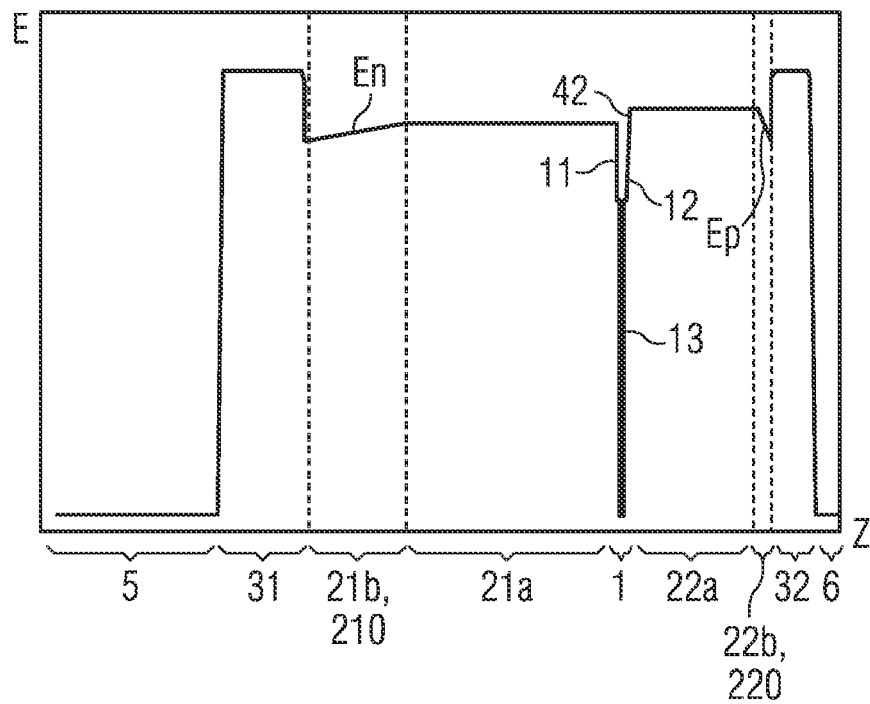
Figure 6B:
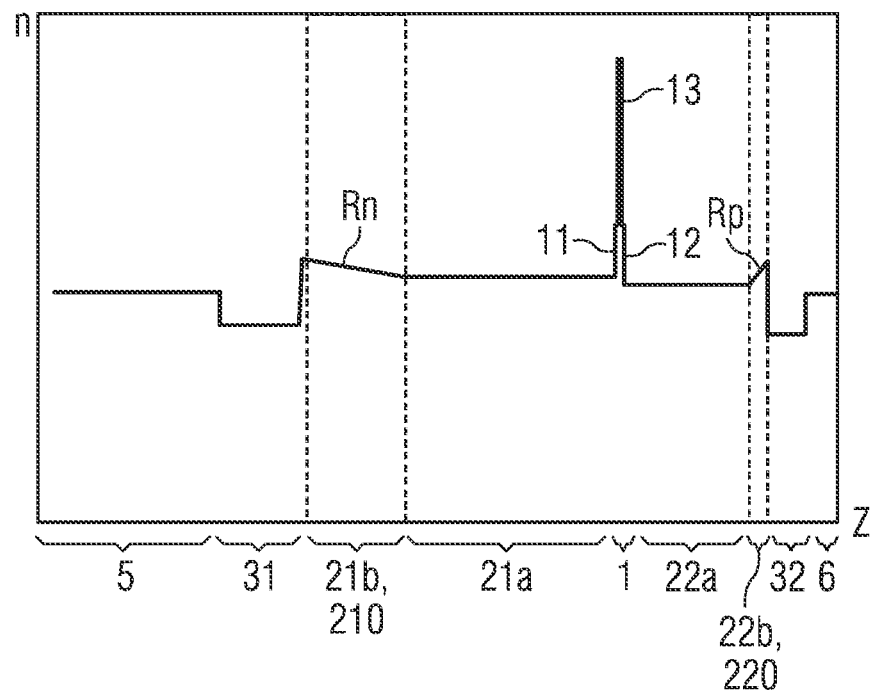

The example of a layer structure of a semiconductor laser 10 shown in FIGS. 6A and 6B essentially corresponds to the example of a layer structure shown in FIGS. 4A and 4B. In contrast, the p-side subregion 220 has a significantly lower vertical layer thickness than the n-side subregion 210. The vertical layer thickness of the subregion 220 in FIGS. 6A and 6B can be 0.1 µm to 4 µm. In addition, the semiconductor laser 10 has an electron barrier 42 formed in a border area of the waveguide 2 to the active zone 1.

In particular, the electron barrier 42 is formed by different Al-proportions in the subareas 21a and 22a of the waveguide 2 adjacent to the active zone 1. To form the electron barrier 42, the p-side area 22a has a higher Al-proportion than the p-side area 21a. In particular, the electron barrier 42 is formed exclusively by different Al-proportions in the inner edge-side areas 21a and 22a. Similarly, a hole barrier layer can be formed by adjusting the Al-proportion in the edge-side areas 21a and 22a. For example, the edge-side subarea 21a may have a higher Al-proportion than the p-side edge-side subarea 22a. By reducing the Al-proportion in the 210 and/or 220 subregions, the total Al-proportion in waveguide 2 can be compensated.

A reduction of leakage currents can be achieved by the electron barrier and/or hole barrier at the edge-side areas to the active zone 1, wherein undesirable disadvantages such as reduced mode stability, modified near-field or far-field and/or increased losses can be avoided which occur for example in the case of an abrupt, in particular strong modification in the material composition and/or in the doping in the vicinity of the active zone 1 for the formation of the electron or hole barrier.

Figure 7A:
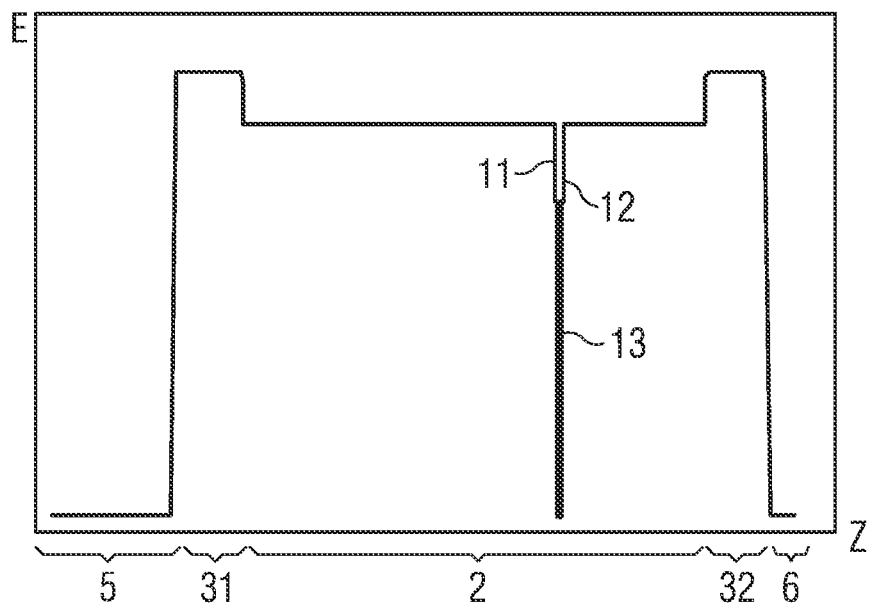
Figure 7B:
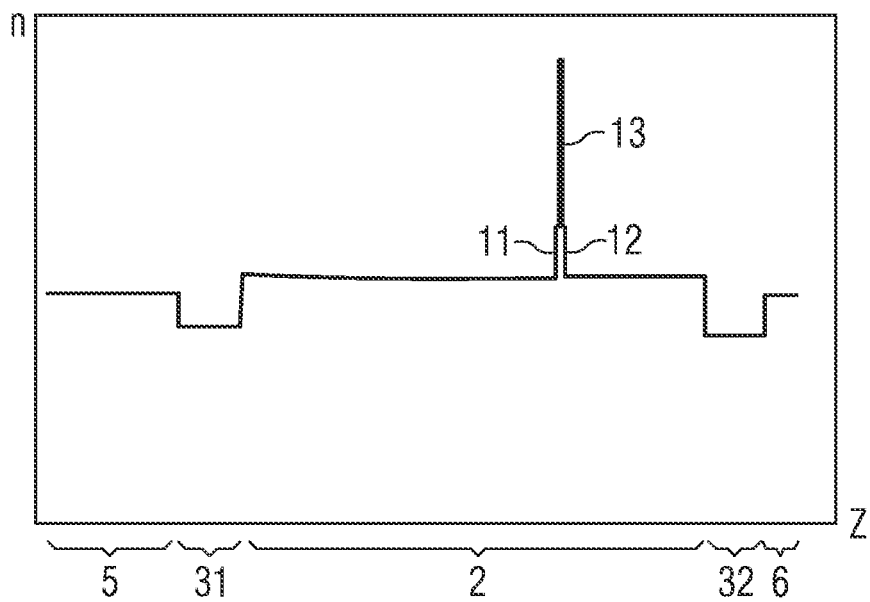

FIGS. 7A and 7B show a comparison example to the example shown in FIGS. 6A and 6B. A semiconductor laser 10 having the layer structure according to FIGS. 6A and 6B and a semiconductor laser 10 having the layer structure according to FIGS. 7A and 7B have a comparable vertical far-field divergence of about 16° (half width). Compared to FIGS. 6A and 6B, however, the layer structure shown in FIGS. 7A and 7B does not show any subregion in which the Al-proportion is reduced or decreases with increasing distance from the active zone 1. We found that the semiconductor laser 10 or the semiconductor body of the semiconductor laser 10 has an increased overall vertical height of several µm as shown in FIGS. 7A and 7B compared to the example shown in FIGS. 6A and 6B. Correspondingly, the semiconductor laser 10 having a layer structure as shown in FIGS. 7A and 7B are formed to be thicker, with corresponding consequences for series resistance and efficiency.

Figure 8A:
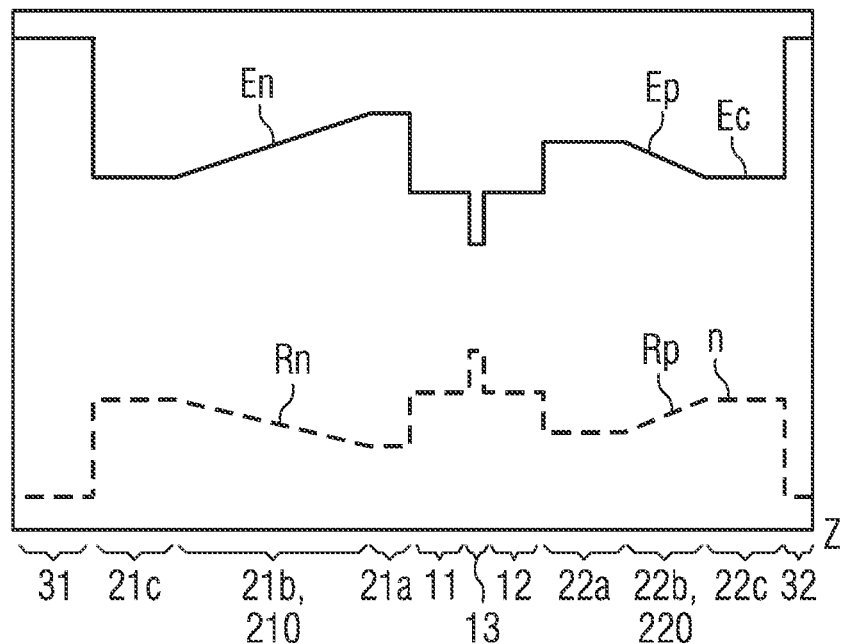
Figure 8B:
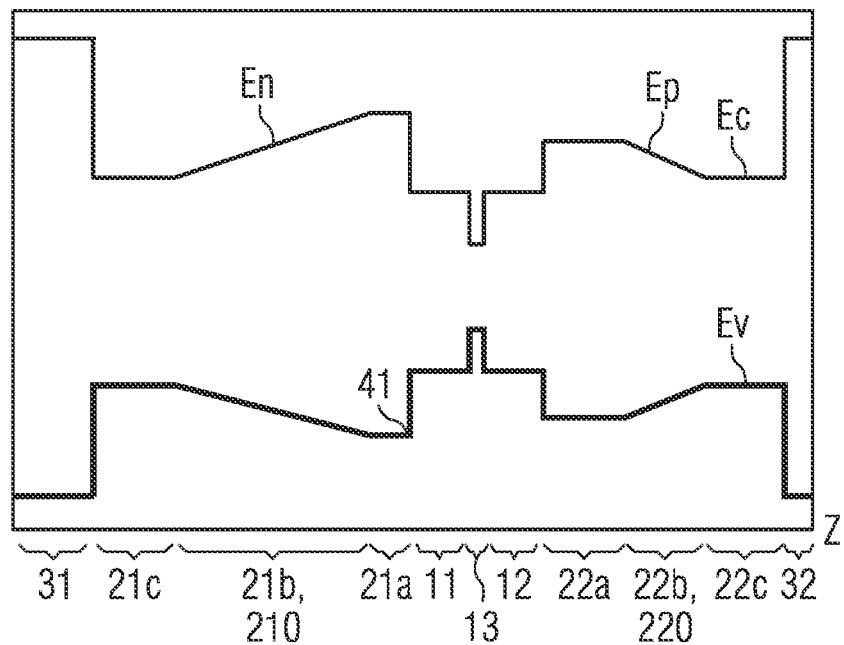

The example of a layer structure of a semiconductor laser shown in FIG. 8A essentially corresponds to the example of a layer structure shown in FIG. 5D. In contrast, the n-side subarea 21a has a higher Al-proportion and thus an increased band gap compared to the p-side subarea 22a. Accordingly, a hole barrier 41 is formed at the edge Ev of the valence band, which is shown schematically for instance in FIG. 8B.

Figure 8C:
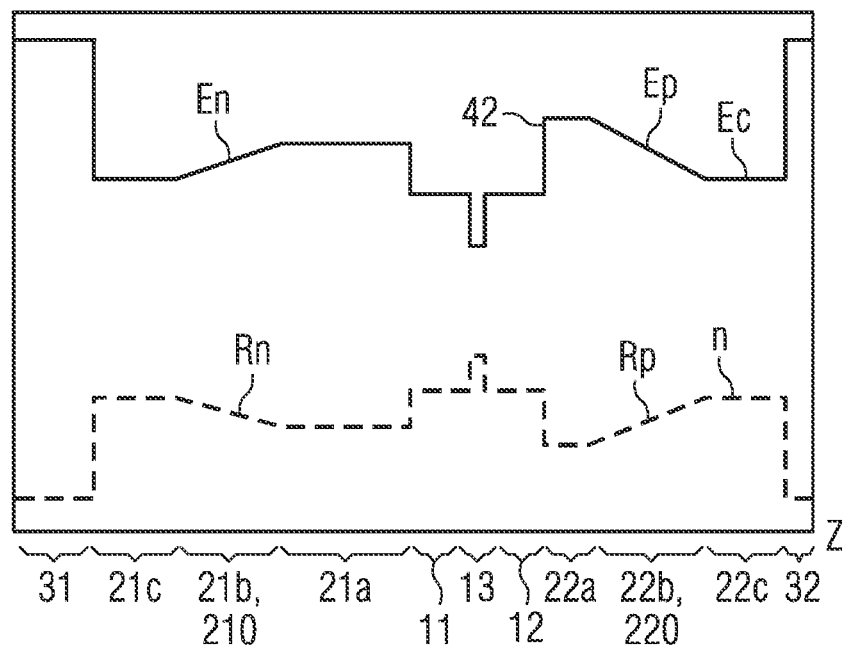

The example of a layer structure of a semiconductor laser shown in FIG. 8C essentially corresponds to the example of a layer structure shown in FIG. 8A. In contrast to FIG. 8A, the p-edge-side subarea 22a in FIG. 8C has a higher Al-proportion than the n-edge-side subarea 21a. Accordingly, an electron barrier 42 is formed at the edge of the conduction band Ec.

Figure 9A:
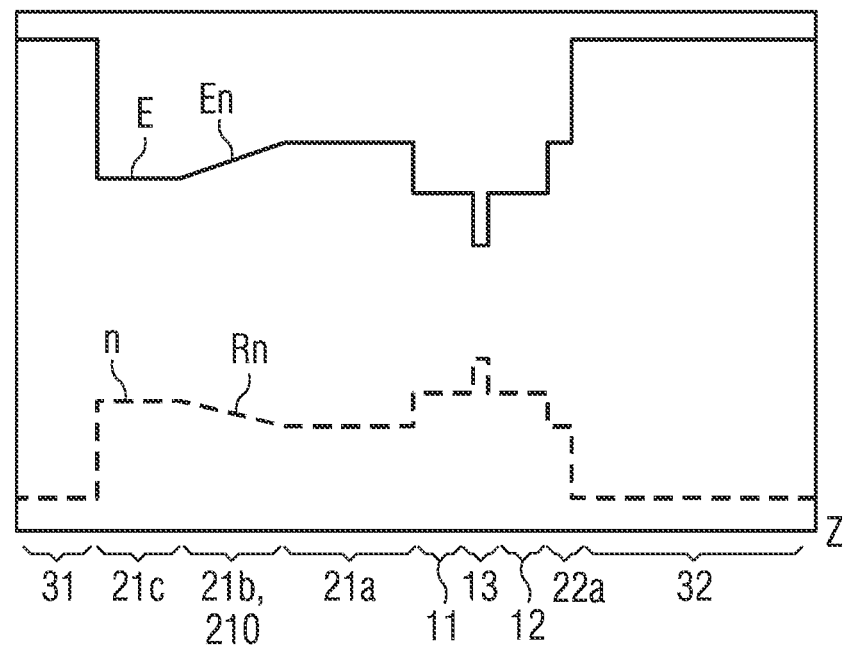

FIG. 9A shows an example of a layer structure essentially corresponding to the examples shown in FIGS. 5C and 5D. In contrast to this, the p-side area 22 of the waveguide 2 is free from a subregion 220 having a varying Al-proportion. The p-side area 22 has only a subarea 22a which has a particularly low vertical layer thickness. In other words, the active zone 1 is separated from the p-side cladding layer 32 only by a particularly thin p-side area 22a of the waveguide 2. The subarea 22a has a constant Al-proportion along its vertical extent.

Figure 9B:
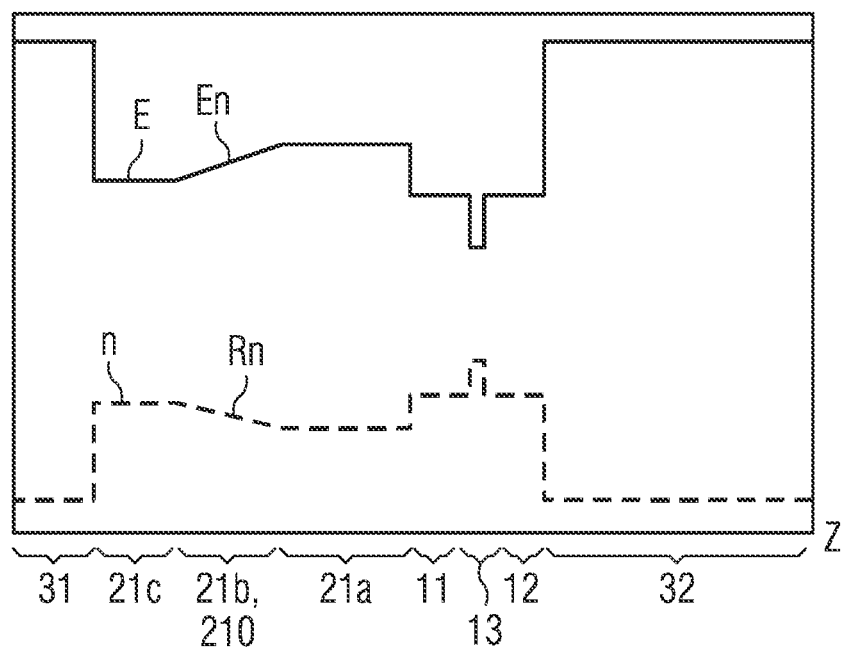

The example shown in FIG. 9B essentially corresponds to the example shown in FIG. 9A. In contrast, the p-side cladding layer 32 directly adjoins the active zone 1. According to FIG. 9B, the semiconductor laser 10 is essentially free or free from a p-side area of the waveguide. According to FIGS. 9A and 9B, the semiconductor laser 10 is formed with particularly thin or without real p-waveguide layers. In general, the suppression of higher vertical modes is particularly difficult in such a semiconductor laser. So far, to suppress higher modes, inter alia, several n-side waveguide layers having corresponding layer thicknesses and different refractive indices, coupling of the higher modes to substrate modes and radiation into the strongly absorptive substrate using a small refractive index jump between the n-side area 2 and the n-side cladding layer 31 have been used. However, such methods often lead to strong efficiency losses. By varying the Al-proportion in the n-side 210 subregion, the series resistance can be reduced, as a result of which a possible reduction in the efficiency of the semiconductor laser is partially compensated or even overcompensated.

The reduction of the Al-proportions in the subareas of the waveguide 2 facing away from active zone 1 also results in an enhancement of the refractive index, as a result of which the electromagnetic radiation in these subareas experiences a comparatively stronger wave guidance. This can lead to higher propagation losses for higher modes due to radiation and absorption in the often higher-doped outer areas of the waveguide 2 and thus to improved side mode suppression. In other words, higher modes are increasingly suppressed by the variation of the Al-proportion in the n-side subregion 210 and/or p-side subregion 220. This applies to all the examples described here and in particular to semiconductor lasers with a particularly thin p-side area 22 of the waveguide 2 or without a real p-waveguide.

Overall, the efficiency of the semiconductor laser and the stability against suddenly occurring power jumps can be increased by improved suppression of undesired, e.g. higher vertical modes. For the desired mode, usually the basic mode, it is possible that the wave guidance in the layers 11 and 12 of the active zone 1 or in the subareas of the waveguide 2 adjacent to the active zone 1 is amplified for instance compared to the reference structure, for example, by increasing the corresponding refractive index.

Figure 10:
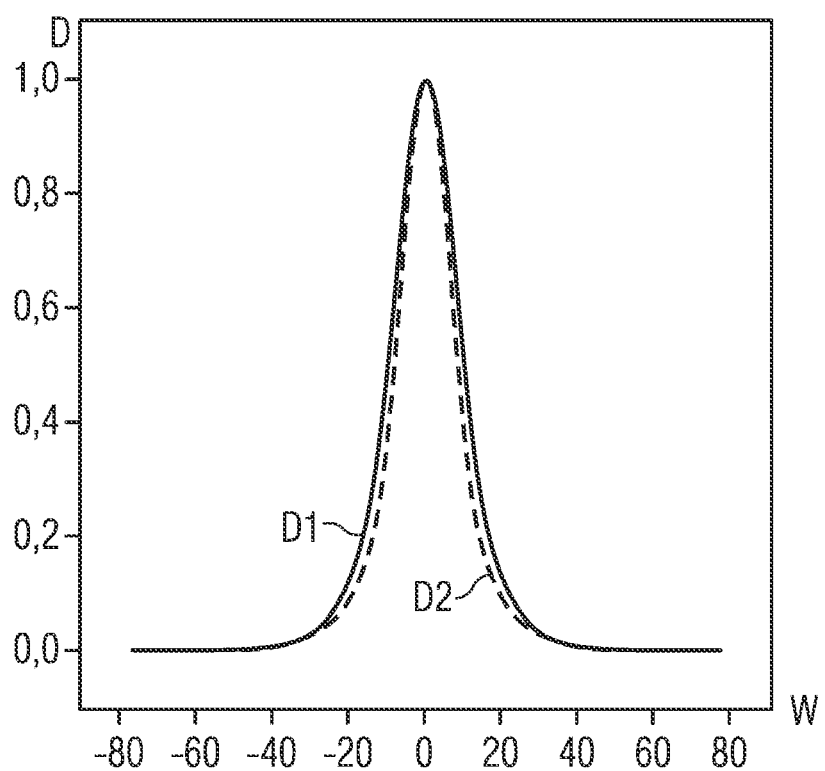
FIG. 10 shows a schematic illustration of a comparison of the vertical far-field divergences of different examples of a semiconductor laser.

FIG. 10 shows a comparison of a vertical far-field divergence of a semiconductor laser without variation of the Al-proportion (curve D1) and a semiconductor laser with variation of the Al-proportion in the waveguide 2 (curve D2). The semiconductor laser associated with curve D2 differs from the semiconductor laser associated with curve D1 only in the Al-proportions in the corresponding layer structures. We found that the vertical far-field according to curve D1 has a far-field divergence of approximately 19° (half width), while the vertical far-field according to curve D2 has a far-field divergence of approximately 16° (half width). Thus, by varying the Al-proportions in the corresponding layers, especially in the n-side subregion 210 and/or in the p-side subregion 220 of the waveguide 2, the vertical far-field divergence can be adjusted according to intended application and specific requirements.

A series resistance of a semiconductor laser can be reduced by gradually modifying the proportion of a material, preferably the Al or P-proportion, in at least one subregion of a waveguide, while maintaining the wave guidance quality at the same time. Also some characteristics of the semiconductor laser such as series resistance, vertical beam divergence and/or an aspect ratio of the beam divergences in vertical and lateral direction, can be influenced more independently from each other by targeted variation of the proportion of the one material in the waveguide.

This application claims priority of DE 10 2016 122 147.3, the subject matter of which is incorporated herein by reference.

Our semiconductor lasers are not restricted to the examples by the description made with reference to examples. This disclosure rather comprises any novel feature and combination of features, including in particular any combination of features in the appended claims, even if the feature or combination is not itself explicitly indicated in the claims or examples.

The invention claimed is:

1. A semiconductor laser comprising an active zone, a waveguide, and an electrode barrier or a hole barrier in an edge-side area of the waveguide or in a border area between the waveguide and the active zone, wherein the active zone comprises an active layer configured to generate electromagnetic radiation during operation of the semiconductor laser, the waveguide is configured to guide the electromagnetic radiation generated during operation of the semiconductor laser within the semiconductor laser, the waveguide comprises a subregion formed from a compound semiconductor material, wherein a proportion of a material of the compound semiconductor material gradually increases in the entire subregion along the vertical direction toward the active zone so that a refractive index of the subregion gradually decreases toward the active zone, the proportion is an aluminum proportion or a phosphorus proportion, and the electron barrier or the hole barrier is formed such that the waveguide has a first Al-proportion in its n-side border area to the active zone and a second Al-proportion different from the first Al-proportion in its p-side border area to the active zone.

2. The semiconductor laser according to claim 1, wherein the aluminum proportion of the compound semiconductor material gradually increases in the entire subregion along the vertical direction toward the active zone.

3. The semiconductor laser according to claim 1, wherein the waveguide has an n-side area and a p-side area, the active zone is arranged in the vertical direction between the n-side area and the p-side area, and the subregion is assigned to the n-side area or the p-side area.

4. The semiconductor laser according to claim 1, wherein the waveguide has two subregions spaced apart from one another and each having an Al-proportion or a phosphorus proportion gradually increasing towards the active zone, an n-side subregion belonging to an n-side area of the waveguide and a p-side subregion belonging to a p-side area of the waveguide.

5. The semiconductor laser according to claim 4, wherein a progression of the proportion of the one material of the n-side subregion and a progression of the proportion of the one material of the p-side subregion each take the form of a ramp gradually ascending towards the active zone, the p-side subregion and the n-side subregion have vertical extensions of different sizes, and the p-side subregion has a higher average proportion of the one material than the n-side subregion.

6. The semiconductor laser according to claim 1, wherein the subregion of the waveguide directly adjoins the active zone.

7. The semiconductor laser according to claim 1, wherein the waveguide has an edge-side subarea adjoining both the subregion and the active zone, and an Al-proportion of the edge-side subarea remains constant or decreases along the vertical direction toward the active zone.

8. The semiconductor laser according to claim 7, wherein the subregion has a lower average Al-proportion than the edge-side subarea.

9. The semiconductor laser according to claim 1, wherein the waveguide has a further edge-side subarea, and the subregion is arranged between the further edge-side subarea and the active zone and an Al-proportion of the further edge-side subarea remains constant or decreases along the vertical direction towards the active zone.

10. The semiconductor laser according to claim 9, wherein the further edge-side subarea is adjacent to a cladding layer of the semiconductor laser, and the further edge-side subarea has a greater refractive index than the subregion and the cladding layer.

11. The semiconductor laser according to claim 1, wherein the subregion having the proportion of the one material gradually increasing towards the active zone is formed by a subarea of an n-side area of the waveguide, the subarea having a vertical layer thickness of at least 0.1 µm.

12. The semiconductor laser according to claim 1, wherein the subregion having a gradually increasing proportion of the one material towards the active zone is formed by a subarea of a p-side area of the waveguide, the subarea having a vertical layer thickness of at least 0.1 µm.

13. The semiconductor laser according to claim 1, formed as a ridge laser and further comprises a ridge projecting in the vertical direction and acting as a p-side waveguide with respect to lateral direction, wherein, to adjust the lateral wave guidance within and below the ridge, the p-side waveguide has a local variation in the proportion of the one material and a local refractive index change associated therewith.

14. The semiconductor laser according to claim 1, further comprising a p-side cladding layer, wherein
the subregion having a gradually increasing proportion of the one material towards the active zone is formed by a subarea of an n-side area, and
the active zone directly adjoins the p-side cladding layer or is spaced apart from the p-side cladding layer exclusively by a p-side area having a maximum layer thickness of 100 nm.

15. The semiconductor laser according to claim 1, wherein the phosphorus proportion of the compound semiconductor material gradually increases in the entire subregion along the vertical direction toward the active zone.

16. A semiconductor laser comprising an active zone and a waveguide, wherein
the active zone comprises an active layer configured to generate electromagnetic radiation during operation of the semiconductor laser,
the waveguide is configured to guide the electromagnetic radiation generated during operation of the semiconductor laser within the semiconductor laser,
the waveguide comprises a subregion formed from a compound semiconductor material, wherein a proportion of a material of the compound semiconductor material gradually increases in the entire subregion along the vertical direction toward the active zone so that a refractive index of the subregion gradually decreases toward the active zone,
the proportion is an aluminum proportion or a phosphorus proportion, the waveguide has a further subregion spatially spaced apart from the subregion, each of the subregions having an Al-proportion or phosphorus proportion gradually increasing towards the active zone, wherein among the subregions, an n-side subregion belongs to an n-side area of the waveguide and a p-side subregion belongs to a p-side area of the waveguide,
a progression of the proportion of the one material of the n-side subregion and a progression of the proportion of the one material of the p-side subregion each take the form of a ramp gradually ascending toward said active zone,
the p-side subregion and the n-side subregion have vertical extensions of different sizes, and
the p-side subregion has a higher average proportion of the one material than the n-side subregion.

17. A semiconductor laser comprising an active zone and a waveguide, wherein
the active zone comprises an active layer configured to generate electromagnetic radiation during operation of the semiconductor laser,
the waveguide is configured to guide the electromagnetic radiation generated during operation of the semiconductor laser within the semiconductor laser,
the waveguide comprises a subregion formed from a compound semiconductor material, wherein a proportion of a material of the compound semiconductor material gradually increases in the entire subregion along the vertical direction toward the active zone so that a refractive index of the subregion gradually decreases toward the active zone, and
the proportion is a phosphorus proportion of the compound semiconductor material that gradually increases in the entire subregion along the vertical direction toward the active zone.

* * * * *